United States Patent
Chen et al.

(10) Patent No.: US 7,639,457 B1
(45) Date of Patent: Dec. 29, 2009

(54) MAGNETIC SENSOR WITH UNDERLAYERS PROMOTING HIGH-COERCIVITY, IN-PLANE BIAS LAYERS

(75) Inventors: Yingjian Chen, Fremont, CA (US); Wei Zhang, Fremont, CA (US); Jinqiu Zhang, Fremont, CA (US); Haifeng Wang, Mountain View, CA (US); Satoru Araki, San Jose, CA (US); Mohamad T. Krounbi, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 44 days.

(21) Appl. No.: 10/788,765

(22) Filed: Feb. 27, 2004

(51) Int. Cl.
G11B 5/39 (2006.01)
G11B 5/127 (2006.01)

(52) U.S. Cl. .............................. 360/324.11; 360/324.12

(58) Field of Classification Search ............ 360/324.11, 360/324.12, 327.2, 327.22, 327.23, 327.3, 360/327.31, 327.32
See application file for complete search history.

(56) References Cited

U.S. PATENT DOCUMENTS

| | | | | |
|---|---|---|---|---|
| 5,434,826 A * | 7/1995 | Ravipati et al. | ............. | 367/140 |
| 5,739,987 A * | 4/1998 | Yuan et al. | ............. | 360/327.32 |
| 5,742,459 A * | 4/1998 | Shen et al. | ............. | 360/327.32 |
| 6,144,534 A * | 11/2000 | Xue et al. | ............. | 360/327.31 |
| 6,172,859 B1 * | 1/2001 | Watanabe et al. | ........ | 360/327.3 |
| 6,185,081 B1 * | 2/2001 | Simion et al. | ............. | 360/327.3 |
| 6,411,476 B1 * | 6/2002 | Lin et al. | ................ | 360/324.11 |
| 6,449,135 B1 * | 9/2002 | Ding et al. | ............. | 360/327.31 |
| 6,636,395 B1 * | 10/2003 | Terunuma | ............... | 360/324.11 |
| 6,668,443 B2 * | 12/2003 | Chien et al. | ............. | 29/603.18 |
| 6,714,388 B2 * | 3/2004 | Hasegawa et al. | ...... | 360/324.11 |
| 6,731,479 B2 * | 5/2004 | Ooshima et al. | ........ | 360/324.12 |
| 6,760,200 B2 * | 7/2004 | Hasegawa | ............... | 360/324.12 |
| 6,833,981 B2 * | 12/2004 | Suwabe et al. | ........... | 360/324.1 |
| 7,190,560 B2 * | 3/2007 | Gill | ........................ | 360/324.11 |
| 7,286,329 B1 | 10/2007 | Chen et al. | | |
| 7,342,752 B1 * | 3/2008 | Zhang et al. | ........... | 360/324.12 |
| 2003/0011947 A1 * | 1/2003 | Saito et al. | ............. | 360/324.11 |
| 2003/0030947 A1 * | 2/2003 | Ooshima | ............... | 360/324.12 |

* cited by examiner

*Primary Examiner*—Brian E. Miller
(74) *Attorney, Agent, or Firm*—Virtual Law Partners LLP

(57) ABSTRACT

A magnetic sensor is disclosed comprising an antiferromagnetic layer; a first ferromagnetic layer disposed over the antiferromagnetic layer, the first ferromagnetic layer having a magnetization that is pinned by the antiferromagnetic layer; a second ferromagnetic layer disposed over the first ferromagnetic layer, the second ferromagnetic layer having a magnetization that rotates due to an applied magnetic field; a third ferromagnetic layer disposed adjacent to an end of the second ferromagnetic layer, the third ferromagnetic layer having a primarily in-plane magnetization providing a magnetic field to stabilize the end of the second ferromagnetic layer; an amorphous, metallic, nonmagnetic underlayer disposed adjacent to the antiferromagnetic layer; and a crystalline seed layer disposed between the underlayer and the third ferromagnetic layer, the seed layer having a crystalline structure that promotes the in-plane magnetization of the third ferromagnetic layer.

48 Claims, 2 Drawing Sheets

| Substrate | Underlayer 150 | Seed Layer 151 | Bias Layer 152 | Mrt | Hcr(RMM) | Hc(VSM) | S*(RMM) | Sq(VSM) |
|---|---|---|---|---|---|---|---|---|
| Si | | Cr 7nm | CoPt | 1 | 2119 | 1987 | 0.87 | 0.87 |
| Si | | Cr 7nm | CoCrPtTa | 1 | 1940 | 1805 | 0.84 | 0.84 |
| Si | | CrTi 7nm | CoPt | 1 | 2413 | 2190 | 0.84 | 0.84 |
| Si | | CrTi 7nm | CoCrPtTa | 1 | 2240 | 2045 | 0.86 | 0.86 |
| Si/TaNiFeCr/PtMn | | Cr 7nm | CoPt | 1 | 812 | 577 | 0.86 | 0.51 |
| Si/TaNiFeCr/PtMn | | CrTi 7nm | CoPt | 1 | 1300 | 1008 | 0.81 | 0.79 |
| Si/TaNiFeCr/PtMn | NiNb 5nm | Cr 7nm | CoPt | 1 | 1100 | 1199 | 0.86 | 0.80 |
| Si/TaNiFeCr/PtMn | NiNb 5nm | Cr 7nm | CoCrPtTa | 1 | 1230 | 1038 | 0.75 | 0.77 |
| Si/TaNiFeCr/PtMn | NiNb 5nm | CrTi 7nm | CoPt | 1 | 2250 | 2410 | 0.83 | 0.84 |
| Si/TaNiFeCr/PtMn | NiNb 5nm | CrTi 7nm | CoCrPtTa | 1 | 2245 | 2078 | 0.84 | 0.85 |

FIG. 3

MAGNETIC SENSOR WITH UNDERLAYERS PROMOTING HIGH-COERCIVITY, IN-PLANE BIAS LAYERS

TECHNICAL FIELD

The present invention relates to electromagnetic transducers and magnetoresistive sensors. For example such sensors may be employed in a magnetic head for a disk drive.

BACKGROUND

The employment of magnetoresistive (MR) sensors for reading signals from media is well known. MR sensors read signals from the media by detecting a change in resistance of the sensor due to magnetic fields from the media. Many variations of MR sensors are known, such as anisotropic magnetoresistive (AMR) sensors, dual stripe magnetoresistive (DSMR) sensors, giant magnetoresistive (GMR) sensors, spin valve (SV) sensors, dual spin valve (DSV) sensors and current-perpendicular to plane (CPP) sensors such as spin-dependent tunneling (SDT) sensors.

Common to these sensors is the need to provide bias fields, both to eliminate noise and to facilitate signal readout. A known means for biasing the sensor involves forming a permanent magnet next to ends of the sensor that form part of a contiguous junction across plural sensor layers. Conductive leads may be formed on the permanent magnet layers next to the contiguous junction.

In order to form contiguous junctions, a sensor is typically deposited in layers and then sensor ends are defined by masking and ion beam milling or etching (IBE), reactive ion etching (RIE) or the like. Before the mask that protected the sensor layers during etching has been removed, bias and lead layers are deposited adjacent the ends to form junctions. Removing the mask lifts off the bias and lead materials that have been deposited on the mask, leaving the bias and lead layers on both sides of the junctions.

FIG. 1 shows a prior art sensor 20 with contiguous junctions (CJ) 22 disposed between the sensor and material that provides electrical current and magnetic bias fields to the sensor. The view in FIG. 1 is one that would be seen from a medium facing the sensor and looking through a thin diamond coating of the sensor. The sensor 20 has been formed on a major surface of a substrate 25 such as a silicon, alumina or alumina-titanium-carbide wafer.

Atop the substrate 25 a first shield layer 28 of NiFe was formed. A read gap layer 30 of alumina ($Al_2O_3$) was formed over the first shield 28, and an antiferromagnetic (AF) layer 33 was formed atop the read gap 30. Atop the AF layer 33 is a pinned ferromagnetic layer 40, a non-magnetic, electrically conducting spacer layer 42 such as copper or gold, a free ferromagnetic layer 44, and a protective cap layer 46. After these layers were deposited, a dual layer lift-off mask, not shown in this figure, was patterned atop the sensor layers. The sensor layers were then milled by rotating IBE to create the CJ 22, partially milling the read gap layer 30.

Underlayers 50 were then formed of chromium (Cr), on the exposed read gap 30 and CJ 22. Permanent magnet bias layers 52 were then formed on the underlayers 50, followed by lead layers 55. A second read gap layer 60 were formed to electrically isolate the sensor layers from a second shield 62.

It is known that a predominantly (002) Cr seed layer structure induces an in-plane (1120) in cobalt based alloys. The Cr (002) structure, however, typically requires substrate heating of over 200° C. during the deposition process, which is not compatible with wafer fabrication processes of magnetic heads.

Without substrate heating, the present inventors have observed a predominantly (110) Cr crystalline structure when Cr is deposited on glass, oxidized silicon (Si), or alumina-coated AlTiC substrates. The (110) Cr texture promotes a mostly (1011) crystalline structure in a subsequently deposited Co-based layer, for which the C-axis of cobalt is tilted out-of-plane by 28°. In addition, a substantial number of Co crystallites would have the C-axis perpendicular to the plane, which could be favorable for CJ 22 and hard bias layers that are nearly perpendicular to the sensor layers, but detrimental for CJ 22 and hard bias layers that are removed from perpendicular to the sensor layers. Moreover, the present inventors have discovered that a Cr underlayer may grow without a preferred texture, which can randomize the C-axis orientation of the adjoining Co-based layer, reducing its magnetic moment and coercivity. The present inventors have also discovered that other layers that do not adjoin the bias layers can negatively affect the crystalline structures of the bias layers, reducing the coercivity and magnetic moment of the bias layers. For example, an AF layer 33 formed of platinum-manganese (PtMn) has a strong texture that may transcend a Cr underlayer 50, denigrating the crystalline structure of the overlying bias layers 52.

SUMMARY

A magnetic sensor is disclosed comprising an antiferromagnetic layer; a first ferromagnetic layer disposed over the antiferromagnetic layer, the first ferromagnetic layer having a magnetization that is pinned by the antiferromagnetic layer; a second ferromagnetic layer disposed over the first ferromagnetic layer, the second ferromagnetic layer having a magnetization that rotates due to an applied magnetic field; a third ferromagnetic layer disposed adjacent to an end of the second ferromagnetic layer, the third ferromagnetic layer having a primarily in-plane magnetization providing a magnetic field to stabilize the end of the second ferromagnetic layer; an amorphous, metallic, nonmagnetic underlayer disposed adjacent to the antiferromagnetic layer; and a crystalline seed layer disposed between the underlayer and the third ferromagnetic layer, the seed layer having a crystalline structure that promotes the in-plane magnetization of the third ferromagnetic layer.

DESCRIPTION OF THE FIGURES

FIG. 3 is a table of experimental data comparing magnetic properties of some hard bias layers formed on different substrates, underlayers and seed layers.

PREFERRED EMBODIMENTS

Figure 1:
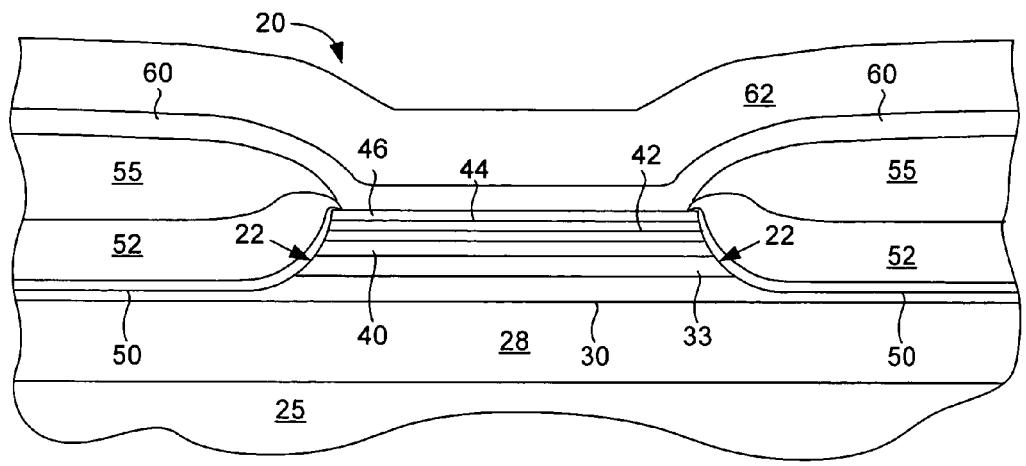
FIG. 1 is a cutaway cross-sectional view of a prior art magnetoresistive (MR) sensor.
Figure 2:
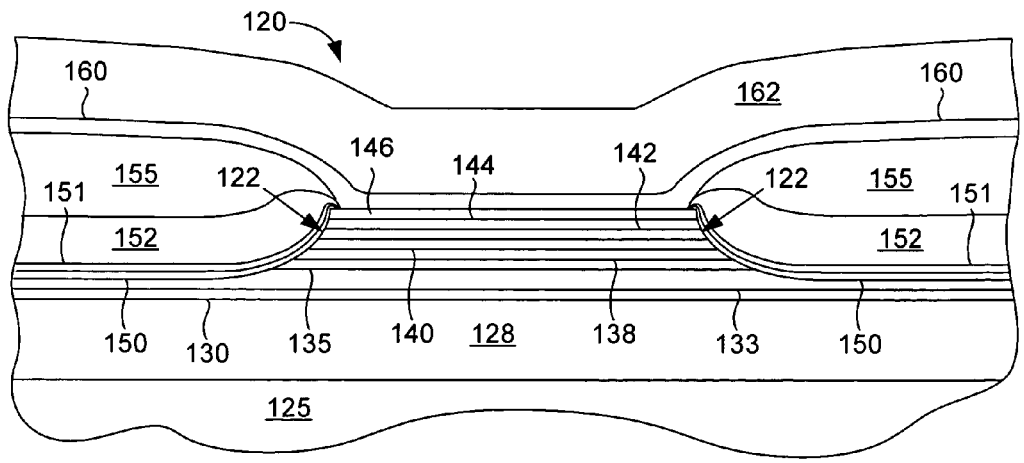
FIG. 2 is a cutaway cross-sectional view of a MR sensor having a shallow contiguous junction with an amorphous, metallic, nonmagnetic underlayer and a crystalline seed layer adjacent a magnetically hard bias layer.

FIG. 2 shows a GMR sensor 120 with a shallow CJ 122. In this embodiment the ion milling that defined the CJ 122 was terminated prior to penetrating most if not all of an AF layer 133, so the AF layer extends substantially further than the other sensor layers in a track-width direction that is parallel to the wafer surface and left-to-right in FIG. 2. Such a shallow CJ is described in the U.S. patent application Ser. No. 10/788,656 entitled "GMR SENSOR WITH SHALLOW CONTIGUOUS JUNCTION AND BIAS LAYERS ALIGNED WITH FREE SENSOR LAYERS," filed by Express Mail No. EL226618635US, on Feb. 27, 2004, which is incorporated by reference. For example, the AF layer 133 may extend at least ten times as far as the free layer 144 in the track-width direction. Alternative embodiments of the present disclosure may include a relatively steep contiguous junction.

In the embodiment shown in FIG. 2, the sensor 120 has been formed on a major surface of a wafer substrate 125 such that the CJ 122 forms an acute angle with the surface of between about 45 degrees and about 20 degrees, when measured at a location about one hundred nanometers below the top of the protective cap 146. In other embodiments the angle may be different. Atop the substrate 125 a first shield layer 128 of magnetically soft material, such as NiFe, has been formed. A submicron read gap layer 130 has been formed, on which the AF layer 133, a first pinned ferromagnetic layer 135, a noble metal layer 138, a second pinned ferromagnetic layer 140, a non-magnetic, electrically conducting spacer layer 142, a free ferromagnetic layer 144, and a protective cap layer 146 have been formed.

Because the ion milling process may terminate before milling any of the read gap layer 130 to create the shallow CJ 122, the read gap layer 130 can be made thinner than is conventional, for example ten nanometers or less. This thinner read gap layer 130 in turn increases the resolution of the sensor 122, by decreasing the shield-to-shield spacing.

Amorphous, metallic, nonmagnetic underlayers 150 were then formed over the antiferromagnetic layer and adjoining the CJ 122. Crystalline seed layers 151 were then formed atop the underlayers 150, the seed layers having crystalline structures that promote the in-plane magnetization of magnetically hard ferromagnetic layers 152 formed over the seed layers to provide bias fields to the free layer 144. Electrically conductive leads 155 were then formed out of gold (Au), copper (Cu), aluminum (Al) or other materials over the bias layers 155, after which the mask disposed atop the protective cap 146 was lifted off. A second read gap layer 160 was formed of electrically insulating, non-magnetic material such as alumina, followed by a second magnetically soft shield layer 162.

The underlayers 150 isolate the bias layers 152 from the crystalline structure of the AF layer, which may be an alloy containing manganese (Mn), such as platinum-manganese (PtMn), palladium-platinum-manganese (PdPtMn), or iridium-manganese (IrMn). Amorphous, metallic, nonmagnetic underlayers 150 may be made of single element materials such as gallium or tantalum. Alternatively, the underlayers 150 may include two elements X and Y, wherein X is selected from the group consisting of nickel, cobalt, iron, copper or aluminum, and Y is selected from the group consisting of niobium, phosphorous, zirconium, hafnium, tantalum, gallium, terbium, bismuth or dysprosium. As one example, the underlayers 150 may include nickel-niobium, which has been found to work well. To isolate the seed layers 151 from the crystalline structure of the AF layer 133, the amorphous underlayers 150 may have a thickness of at least about ten manometers between the AF layer and the seed layers. The underlayers 150 may have a thickness that is at least one hundred nanometers to help promote alignment between the bias layers 152 and the free layer 144.

The seed layers 151 may be made of chromium or a chromium alloy that includes an element selected from the group consisting of titanium, vanadium, molybdenum, manganese or tungsten. Such a chromium alloy may have an atomic concentration of chromium that is between fifty percent and ninety-five percent. The seed layers 151 may have a body-centered cubic (bcc) crystalline structure, such as exemplified by chromium. Alternatively, the seed layers 151 may have a B2 crystalline structure such as exemplified by nickel-aluminum. The seed layers 151 may be made of tungsten or a tungsten alloy that includes an element selected from the group consisting of titanium, vanadium, molybdenum or chromium. To form hard magnetic bias layers 152 having a crystalline structure that is approximately lattice matched with that of the seed layers 151, the seed layers may have a thickness of at least about ten manometers between the underlayers 150 and the bias layers 152. The seed layers 151 may have a thickness that is at least one hundred nanometers to help promote alignment between the bias layers 152 and the free layer 144.

The hard bias layers 152 may include cobalt, and may for example may be formed of a cobalt-based alloy such as cobalt-platinum (CoPt), cobalt-chromium-platinum (CoCrPt), cobalt-chromium-platinum-tantalum (CoCrPtTa), or cobalt-chromium-platinum-boron (CoCrPtB). Although described as single layers for clarity, any of layers 150, 151, 152 or 155 may be formed of plural layers.

FIG. 3 shows some experimental data comparing magnetic properties of some hard bias layers 152 formed on different substrates, underlayers 150 and seed layers 151. Forming the bias layers 152 on selected substrates rather than magnetic sensors allows the bias layers' magnetic properties to be more easily determined. The substrates chosen were silicon (Si) or silicon layered with tantalum-nickel-iron-chromium followed by platinum-manganese (Si/TaNiFeCr/PtMn), to approximate the texture found in one embodiment beneath a bias layer 152 where the AF layer 133 has been partially milled. The magnetic remanence-thickness product (Mrt in emu/cm$^2$) was set to unity. The remanence coercivity (Hcr) was measured with a remanence moment magnetometer (RMM) and the coercivity was measured with a vibrating sample magnetometer (VSM). Similarly, S-star was measured with the RMM and magnetic squareness (Sq) was measured with the VSS.

The effects of employing an amorphous, nonmagnetic, electrically conductive underlayer 150 of nickel-niobium (NiNb) are evident. On the Si substrate, a remanence coercivity Hcr(RMM) of 2199 was found for a CoPt bias layer and a remanence coercivity Hcr(RMM) of 1940 was found for a CoCrPtTa bias layer, both of which are acceptable. The remanence coercivity Hcr(RMM) of a CoPt bias layer 152 grown on a chromium-titanium (CrTi) seed layer over the silicon substrate was better, at 2413. On the Si/TaNiFeCr/PtMn structure, however, remanence coercivity Hcr(RMM) of a CoPt bias layer grown on a Cr seed layer was only 812 and the remanence coercivity Hcr(RMM) of a CoPt bias layer grown on a CrTi seed layer was only 1300, neither of which is acceptable. The highest bias layer remanence coercivity Hcr (RMM) measurement was 2550, obtained with a NiNb underlayer atop the Si/TaNiFeCr/PtMn structure, a CrTi seed layer and a CoPt bias layer, which is a dramatic improvement over the remanence coercivity Hcr(RMM) that was measured atop the Si/TaNiFeCr/PtMn structure without the NiNb underlayer.

The invention claimed is:

1. A magnetic sensor comprising:
   an antiferromagnetic layer;
   a first ferromagnetic layer disposed over the antiferromagnetic layer, the first ferromagnetic layer having a magnetization that is pinned by the antiferromagnetic layer;

a second ferromagnetic layer disposed over the first ferromagnetic layer, the second ferromagnetic layer having a magnetization that rotates due to an applied magnetic field;

a third ferromagnetic layer disposed adjacent to an end of the second ferromagnetic layer, the third ferromagnetic layer having a primarily in-plane magnetization providing a magnetic field to stabilize the end of the second ferromagnetic layer;

an amorphous, metallic, nonmagnetic underlayer disposed adjacent to the antiferromagnetic layer; and a crystalline seed layer disposed between the underlayer and the third ferromagnetic layer, the seed layer having a crystalline structure that promotes the in-plane magnetization of the third ferromagnetic layer.

2. The sensor of claim 1, wherein the underlayer isolates the third ferromagnetic layer from the crystalline structure of the antiferromagnetic layer.

3. The sensor of claim 1, wherein the underlayer includes gallium or tantalum.

4. The sensor of claim 1, wherein the underlayer includes elements X and Y, wherein X is selected from the group consisting of nickel, cobalt, iron, copper or aluminum, and Y is selected from the group consisting of niobium, phosphorous, zirconium, hafnium, tantalum, gallium, terbium, bismuth or dysprosium.

5. The sensor of claim 1, wherein the underlayer includes nickel-niobium.

6. The sensor of claim 1, wherein the seed layer includes chromium.

7. The sensor of claim 1, wherein the seed layer is a chromium alloy, and includes an element selected from the group consisting of titanium, vanadium, molybdenum, manganese or tungsten.

8. The sensor of claim 1, wherein the seed layer has a body-centered cubic (bcc) crystalline structure.

9. The sensor of claim 1, wherein the seed layer has a B2 crystalline structure.

10. The sensor of claim 1, wherein the seed layer is made of a tungsten alloy, and includes an element selected from the group consisting of titanium, vanadium, molybdenum or chromium.

11. The sensor of claim 1, wherein the seed layer includes tungsten.

12. The sensor of claim 1, wherein the seed layer includes an atomic concentration of chromium that is between fifty percent and ninety-five percent.

13. The sensor of claim 1, wherein the seed layer has a crystalline structure that is approximately lattice matched with that of the third ferromagnetic layer.

14. The sensor of claim 1, wherein the seed layer includes nickel-aluminum.

15. The sensor of claim 1, wherein the antiferromagnetic layer includes manganese.

16. The sensor of claim 1, wherein the third ferromagnetic layer includes cobalt.

17. The sensor of claim 1, wherein the antiferromagnetic layer extends more than twice as far as the free layer in a track width direction.

18. A magnetic sensor comprising:

an antiferromagnetic layer having a crystalline structure;

a pinned ferromagnetic layer disposed over the antiferromagnetic layer;

a free ferromagnetic layer disposed over the pinned ferromagnetic layer, the free ferromagnetic layer having a magnetization that rotates due to an applied magnetic field;

a pair of magnetically hard bias layers disposed adjacent to opposite ends of the free ferromagnetic layer, the bias layers having a primarily in-plane magnetization providing a magnetic field to stabilize the ends of the free ferromagnetic layer;

a pair of amorphous, metallic, nonmagnetic underlayers disposed adjacent to the antiferromagnetic layer to isolate the crystalline structure of the antiferromagnetic layer; and a pair of crystalline seed layers, each of the seed layers disposed between one of the underlayers and one of the bias layers to promote the in-plane magnetization of the bias layers.

19. The sensor of claim 18, wherein the underlayers include nickel-niobium.

20. The sensor of claim 18, wherein the underlayers include gallium or tantalum.

21. The sensor of claim 18, wherein the underlayer includes elements X and Y, wherein X is selected from the group consisting of nickel, cobalt, iron, copper or aluminum, and Y is selected from the group consisting of niobium, phosphorous, zirconium, hafnium, tantalum, gallium, terbium, bismuth or dysprosium.

22. The sensor of claim 18, wherein the seed layer includes chromium.

23. The sensor of claim 18, wherein the seed layers are made of a chromium alloy, and include an element selected from the group consisting of titanium, vanadium, molybdenum, manganese or tungsten.

24. The sensor of claim 18, wherein the seed layers are made of a tungsten alloy, and include an element selected from the group consisting of titanium, vanadium, molybdenum or chromium.

25. The sensor of claim 18, wherein the seed layers include tungsten.

26. The sensor of claim 18, wherein the seed layers include a body-centered-cubic (bcc) crystalline structure.

27. The sensor of claim 18, wherein the seed layers include a B2 crystalline structure.

28. The sensor of claim 18, wherein the seed layers include an atomic concentration of chromium that is between fifty percent and ninety-five percent.

29. The sensor of claim 18, wherein the seed layers have a crystalline structure that is approximately lattice matched with that of the bias layers.

30. The sensor of claim 18, wherein the seed layer includes nickel-aluminum.

31. The sensor of claim 18, wherein the antiferromagnetic layer includes manganese.

32. The sensor of claim 18, wherein the bias layers include cobalt.

33. The sensor of claim 18, wherein the antiferromagnetic layer extends more than twice as far as the free layer in a track width direction.

34. A magnetic sensor comprising:

an antiferromagnetic layer having a crystalline structure;

a pinned ferromagnetic layer disposed over the antiferromagnetic layer;

a free ferromagnetic layer disposed over the pinned ferromagnetic layer, the free ferromagnetic layer having a magnetization that rotates due to an applied magnetic field;

a pair of amorphous, metallic, nonmagnetic underlayers disposed adjacent to the antiferromagnetic layer to isolate the crystalline structure of the antiferromagnetic layer;

a pair of crystalline seed layers, each of the seed layers disposed over one of the underlayers; and a pair of magnetically hard bias layers disposed adjacent to opposite ends of the free ferromagnetic layer, each of the bias layers grown on one of the seed layers to have a primarily in-plane magnetization providing a magnetic field to stabilize the ends of the free ferromagnetic layer.

35. The sensor of claim 34, wherein the underlayers include nickel-niobium.

36. The sensor of claim 34, wherein the underlayers include gallium or tantalum.

37. The sensor of claim 34, wherein the underlayer includes elements X and Y, wherein X is selected from the group consisting of nickel, cobalt, iron, copper or aluminum, and Y is selected from the group consisting of niobium, phosphorous, zirconium, hafnium, tantalum, gallium, terbium, bismuth or dysprosium.

38. The sensor of claim 34, wherein the seed layers are made of a chromium alloy, and include an element selected from the group consisting of titanium, vanadium, molybdenum, manganese or tungsten.

39. The sensor of claim 34, wherein the seed layers are made of a tungsten.

40. The sensor of claim 34, wherein the seed layers are made of a tungsten alloy, and include an element selected from the group consisting of titanium, vanadium, molybdenum or chromium.

41. The sensor of claim 34, wherein the seed layers include a body-centered-cubic (bcc) crystalline structure.

42. The sensor of claim 34, wherein the seed layers include a B2 crystalline structure.

43. The sensor of claim 34, wherein the seed layers include an atomic concentration of chromium that is between fifty percent and ninety-five percent.

44. The sensor of claim 34, wherein the seed layers have a crystalline structure that is not lattice matched with the that of the antiferromagnetic layer.

45. The sensor of claim 34, wherein the seed layer includes nickel-aluminum.

46. The sensor of claim 34, wherein the antiferromagnetic layer includes manganese.

47. The sensor of claim 34, wherein the bias layers include cobalt.

48. The sensor of claim 34, wherein the antiferromagnetic layer extends more than twice as far as the free layer in a track width direction.

* * * * *